(12) United States Patent
Tsai

(10) Patent No.: US 7,875,930 B2
(45) Date of Patent: Jan. 25, 2011

(54) SEMICONDUCTOR STRUCTURE HAVING AN ENLARGED FINGER SHAPED REGION FOR REDUCING ELECTRIC FIELD DENSITY AND METHOD OF MANUFACTURING THE SAME

(75) Inventor: Hung-Shern Tsai, Tainan County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 227 days.

(21) Appl. No.: 12/371,852

(22) Filed: Feb. 16, 2009

(65) Prior Publication Data

US 2010/0207207 A1    Aug. 19, 2010

(51) Int. Cl.
*H01L 29/66* (2006.01)
(52) U.S. Cl. .................. 257/343; 257/328; 257/342; 257/339; 438/140; 438/454
(58) Field of Classification Search .......... 257/E29.027, 257/E29.261, E29.12, 343, 328, 342, 339, 257/409, 336; 438/FOR. 192, FOR. 428, 438/140, 454

See application file for complete search history.

(56) References Cited

U.S. PATENT DOCUMENTS

| 5,633,521 | A | * | 5/1997 | Koishikawa | ............... 257/336 |
| 6,084,277 | A | * | 7/2000 | Disney et al. | ............... 257/401 |
| 7,115,958 | B2 | * | 10/2006 | Disney et al. | ............... 257/401 |
| 2004/0178443 | A1 | * | 9/2004 | Hossain et al. | ............... 257/328 |
| 2009/0020814 | A1 | * | 1/2009 | Choi et al. | ............... 257/343 |

* cited by examiner

*Primary Examiner*—Thao X Le
*Assistant Examiner*—Thanh Y Tran

(57) ABSTRACT

The invention provides a semiconductor structure. A first type body doped region is deposited on a first type substrate. A first type heavily-doped region having a finger portion with an enlarged end region is deposited on the first type body doped region. A second type well region is deposited on the first type substrate. A second type heavily-doped region is deposited on the second type well region. An isolation structure is deposited between the first type heavily-doped region and the second type heavily-doped region. A gate structure is deposited on the first type substrate between the first type heavily-doped region and the isolation structure.

19 Claims, 4 Drawing Sheets

US 7,875,930 B2

SEMICONDUCTOR STRUCTURE HAVING AN ENLARGED FINGER SHAPED REGION FOR REDUCING ELECTRIC FIELD DENSITY AND METHOD OF MANUFACTURING THE SAME

BACKGROUND OF THE INVENTION

1. Field of the Invention

The present invention relates to a semiconductor structure.

2. Description of the Related Art

For current integrated circuit processing, controllers, memories, low-voltage (LV) circuits and high-voltage (HV) power devices are integrated into a single chip, referred to as a single-chip system. For example, to handle high voltage and current, double-diffused metal oxide semiconductor (DMOS) transistors, frequently used as conventional power devices, can operate with low on-resistance while sustaining high voltage. Lateral double-diffused metal oxide semiconductor (LDMOS) transistors in particular have a simple structure suitable for incorporation into VLSI logic circuits.

However, the surface field of a lateral double-diffused metal oxide semiconductor limits the voltage tolerance of transistors therein. Moreover, when operating an LDMOS device of an interdigitated structure, a high electric field occurring adjacent to the tip of the finger-shaped source results in decreased breakdown voltage of the device. Particularly, a higher electric field, caused from a smaller device size as well as smaller width of the source or smaller curvature radius of the finger end, results in a very serious decrease of breakdown voltage. However, if the width of the finger shaped source is widened to enlarge the curvature radius of the finger end in order to increase the breakdown voltage and eliminate the problem mentioned above, layout flexibility of the device is sacrificed, thus hindering development for further scaling-down of related devices.

An improved semiconductor device ameliorating the disadvantages of the conventional technology is desirable.

BRIEF SUMMARY OF INVENTION

A detailed description is given in the following embodiments with reference to the accompanying drawings.

The invention provides a semiconductor structure. A first type body doped region is deposited on a first type substrate. A first type heavily-doped region having a finger portion with an enlarged end region is deposited on the first type body doped region. A second type well region is deposited on the first type substrate. A second type heavily-doped region is deposited on the second type well region. An isolation structure is deposited between the first type heavily-doped region and the second type heavily-doped region. A gate structure is deposited on the first type substrate between the first type heavily-doped region and the isolation structure.

The invention also provides a semiconductor structure. A first type body doped region is deposited on a first type substrate. A first type heavily-doped region is deposited on the first type body doped region. The first type heavily-doped region comprises a finger portion and a rectangular ring portion. The finger portion is extended from an interior sidewall of and perpendicular to the rectangular ring portion. An end of the finger portion has an enlarged region and a curved region. A second type well region is deposited on the first type substrate. A second type heavily-doped region is deposited on the second type well region. The second type heavily-doped region is U-shaped and is deposited in a region surrounded by the rectangular ring portion of the first type heavily-doped region. An isolation structure is deposited between the first type heavily-doped region and the second type heavily-doped region. A gate structure is deposited on the first type substrate between the first type heavily-doped region and the isolation structure.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

Figure 1A:
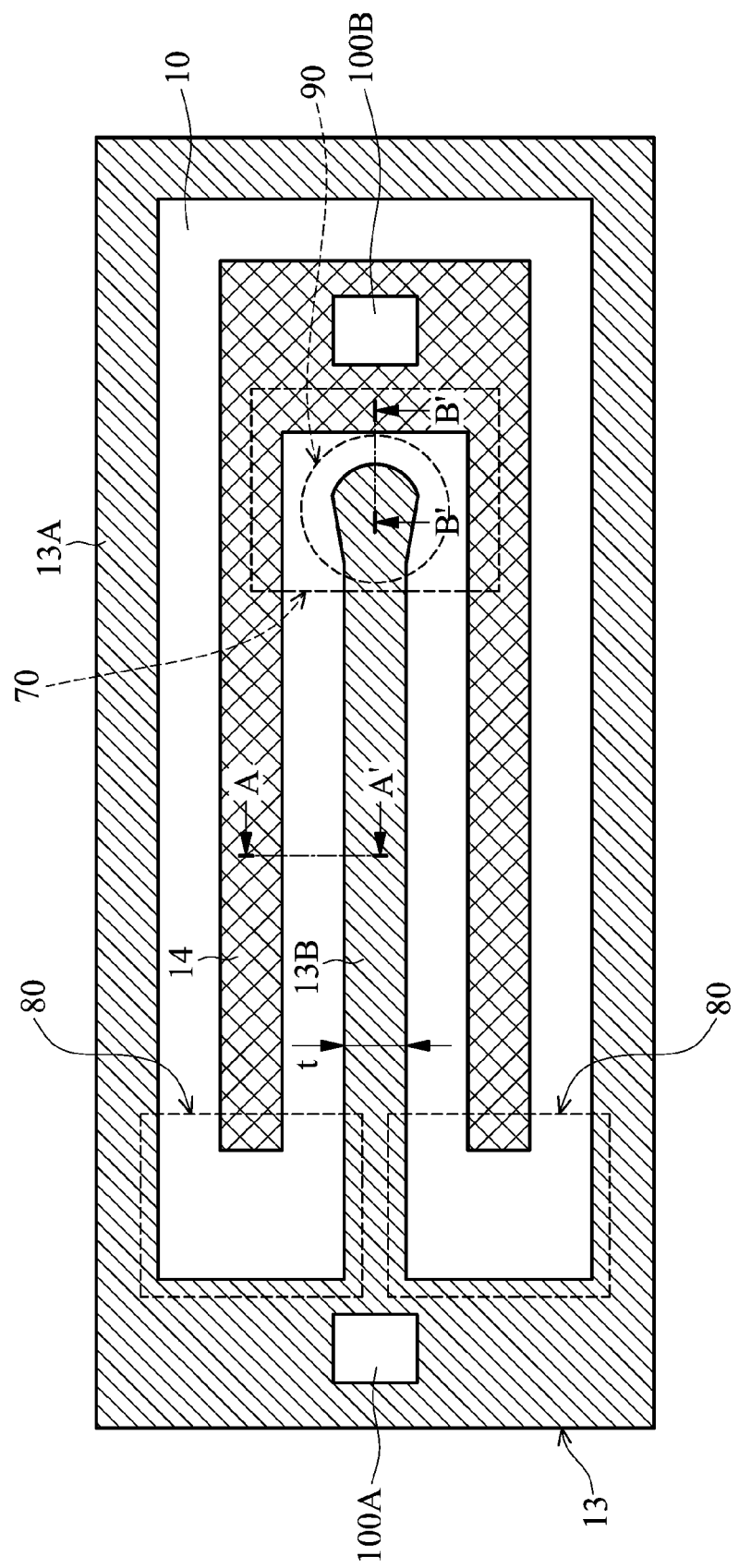
FIG. 1A is a top view of the semiconductor structure of one embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention provide a semiconductor structure. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 2:
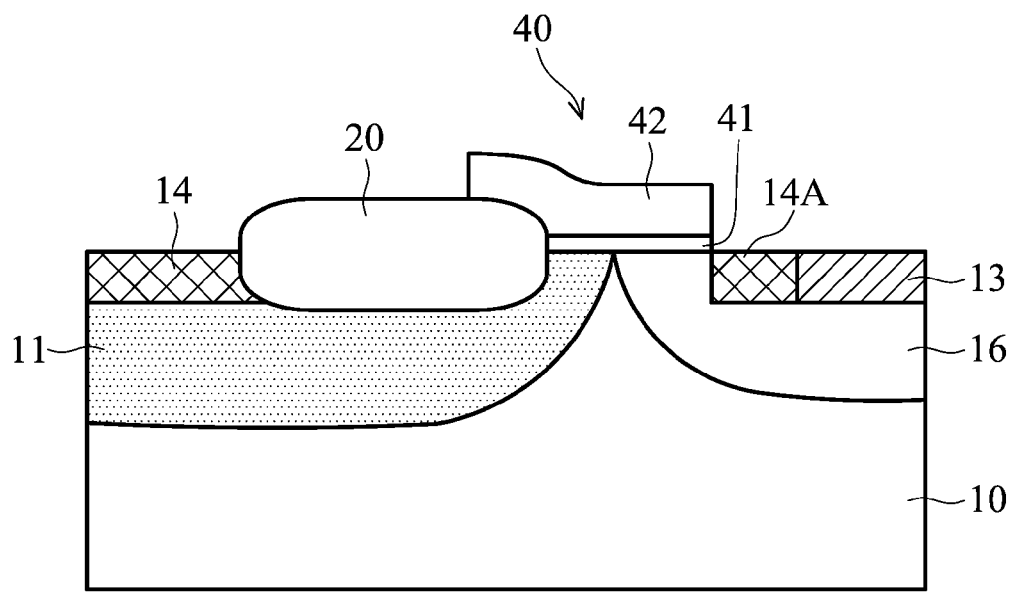
FIG. 2 is a cross-section view of the semiconductor structure along the dotted line AA' in FIG. 1.
Figure 3:
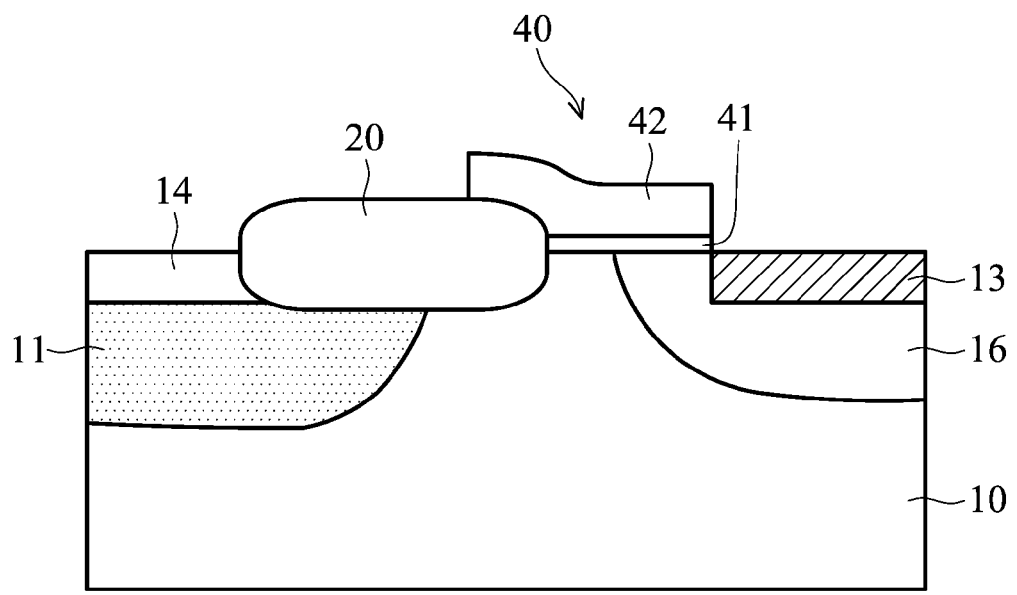
FIG. 3 is a cross-section view of the semiconductor structure along the dotted line BB' in FIG. 1.

FIG. 1 is a top view of the semiconductor structure of an embodiment of the invention. FIG. 2 is a cross-section view of the semiconductor structure along the dotted line AA' in FIG. 1. FIG. 3 is a cross-section view of the semiconductor structure along the dotted line BB' in FIG. 1.

Referring to FIG. 2 and FIG. 3, the semiconductor structure comprises a P− substrate 10. The P− substrate 10 may comprise a silicon-on-insulator (SOI) substrate, bulk silicon substrate, or substrate having a silicon epitaxy layer thereon. Moreover, a P− body doped region 16 and N− well region 11 are formed on the P− substrate 10. In addition, a P+ doped region 13, regarded as an NLDMOS channel region, is formed on the P− body doped region 16. An N+ doped region 14 is formed on the N type well region 11. Note that the difference in FIG. 2 and FIG. 3 is that the semiconductor shown in FIG. 2 comprises an N+ doped region 14A deposited between the N type well region 11 and P+ doped region 13. In one embodiment, the dopant concentration of the N+ doped region 14A is the same as the dopant concentration of the N+ doped region 14. The P type dopant comprises, for example, boron, gallium, aluminum, indium, or combination thereof. The N type dopant comprises, for example, phosphorus, arsenic, nitrogen, antimony, or combination thereof. The dopant concentration can be varied according to manufacturing processes and device characteristics.

Referring to FIGS. 2 and 3, a gate structure 40 is formed on the P− substrate 10 between the P+ doped region 13 and isolation structure 20. Note that the isolation structure 20 is not limited to the example of the field oxide layer, and other isolation structures, such as shallow trench isolation structures, may be used.

Referring to FIGS. 2 and 3, a portion of the isolation structure 20 and P− body doped region 16 is covered by the gate structure 40. A gate dielectric layer 41 of the gate structure 40 may comprise a common dielectric material, such as oxide, nitride, oxynitride, oxycarbide, or combination thereof. Alternatively, the gate dielectric layer 41 may comprise a high-k (>8) dielectric material, such as aluminum oxide (Al2O3), hafnium oxide (HfO2), hafnium oxynitride (HfON), hafnium silicate (HfSiO4), zirconium oxide (ZrO2), zirconium oxynitride (ZrON), zirconium silicate (ZrSiO4), yttrium oxide (Y2O3), lanthanum oxide (La2O3), cerium oxide (CeO2), titanium oxide (TiO2), tantalum oxide (Ta2O5), or combination thereof.

In addition, a gate electrode layer 42 formed on the gate dielectric layer 41 may comprise silicon or polysilicon. The gate electrode layer 42 is preferably a doped material for reducing sheet resistance. In other embodiments, the gate electrode layer 42 is an amorphous silicon. Furthermore, a metal silicide (not shown) may be selectively formed on the surface of the gate electrode layer 42.

Referring to FIG. 3, in one embodiment, the N type well region 11 is deposited under the isolation structure 20. In other embodiments, the N type well region 11 is deposited under the gate dielectric layer 41 (not shown), or further adjacent to the P− body doped region 16. Alternatively, for example, the N type well region 11 shown in FIG. 2 may be deposited under the isolation structure 20, and not adjacent to the P− body doped region 16 (not shown).

FIG. 1A shows the top view of a P− substrate 10, N+ doped region 14, and P+ doped region 13 of a semiconductor structure. Moreover, pads 100A and 100B are deposited on the N+ doped region 14 and P+ doped region 13, respectively. For simplification, other elements in FIGS. 2 and 3 are omitted and not shown in FIG. 1A.

Referring to FIGS. 2 and 3, in one embodiment, a drain voltage $V_{DD}$ (not shown) is applied to the N+ doped region 14, a source voltage $V_{SS}$ (not shown) is applied to the N+ doped region 14A and P+ doped region 13, and a gate voltage $V_G$ (not shown) is applied to the gate structure 40. The gate voltage $V_G$ is same as the drain voltage $V_{DD}$. Alternatively, the gate voltage $V_G$ and the drain voltage $V_{DD}$ may be different. Therefore, the semiconductor structure shown in FIG. 2 may be regarded as an LDMOS device, particularly as a lateral diffused MOS (LDMOS), and the semiconductor structure shown in FIG. 3 may be regarded as a diode device.

Referring to FIG. 1A, the P+ doped region 13 comprises a rectangular ring portion 13A (that may be regarded as an LDMOS channel) and a finger portion 13B. The finger portion 13B is extended from an interior sidewall of and perpendicular to the rectangular ring portion 13A. Moreover, the N+ doped region 14 is U-shaped. The N+ doped region 14 is deposited in a region surrounded by the rectangular ring portion 13A. The U-shaped N+ doped region 14 and the P+ doped region 13 are interdigitated to one another.

Note that, referring to FIG. 1A, the gate structure 40 (not shown) is substantially deposited along the interior sidewall of the P+ doped region 13A. Therefore, the mentioned ring portion 13B is substantially constructed of the finger portion of the P+ doped region and the gate structure along an exterior sidewall of the finger portion of the P+ doped region. For convenience, the invention is described merely using the finger portion 13B of the P+ doped region hereafter.

In one embodiment, the deposition range of the diode device in FIG. 3 is in a region including the end of the P+ doped finger portion 13B, such as region 70 (indicated with a dotted line) shown in FIG. 1A, and the deposition range of the LDMOS device shown in FIG. 2 is in all the other regions except for the diode device region. However, not limited to the region 70 that includes the end of the P+ doped finger portion 13B in FIG. 1A, the diode device range may also be in a region including the end of the finger portion of the N+ doped region 14, such as region 80 (indicated with a dotted line).

For conventional techniques, the rectangular portion 13A and finger portion 13B of the P+ doped region 13 are both LDMOS devices. However, the finger end portion of the LDMOS has a high density surface electric field (crowded electric field), thus reducing breakdown voltage of the LSMOS device. Therefore, decreasing device lifespan. In embodiments of the invention, the finger end region is the diode to effectively reduce surface electric field density, thus improving upon a crowded electric field.

Figure 1B:
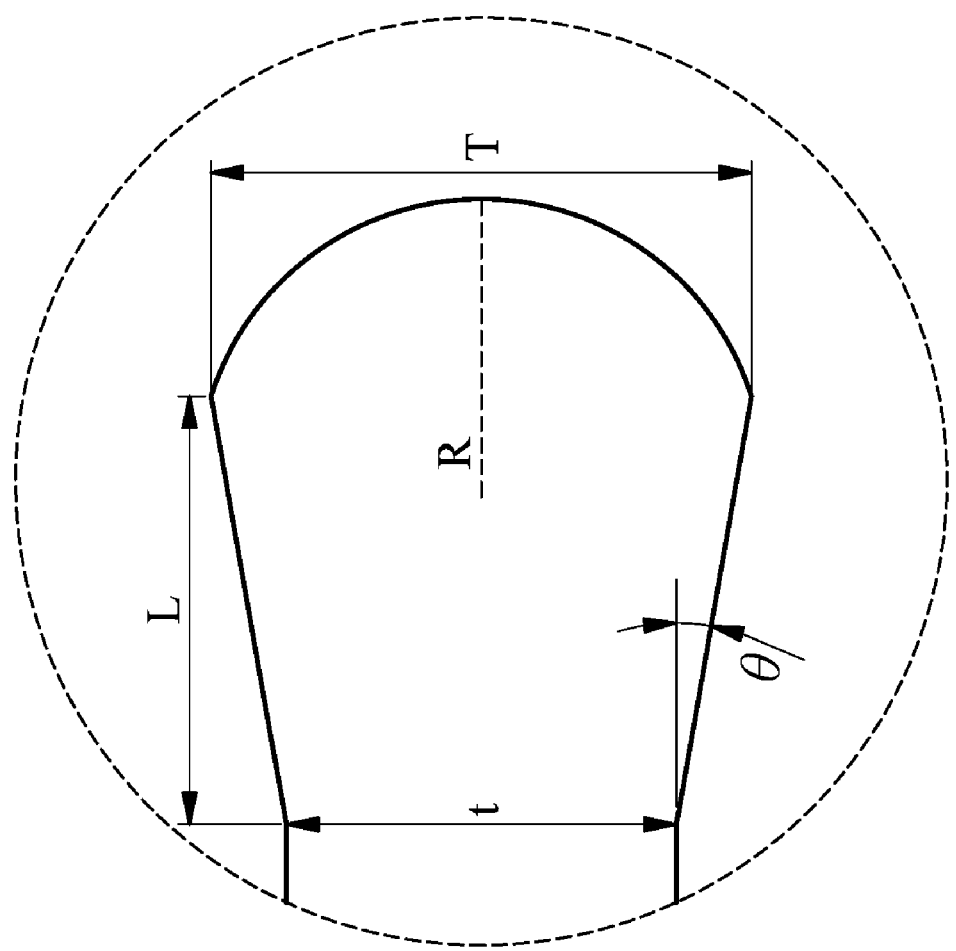
FIG. 1B is an enlarged view of the doped finger end region in FIG. 1A.

FIG. 1B is an enlarged view of the end region 90 (indicated with dotted line), not adjoined to the rectangular ring portion 13A, of the finger portion 13B of the P+ doped region in FIG. 1A. Referring to FIG. 1B, the end of the P+ doped finger portion 13B has a shape symmetrically widened from the narrowest width t (equal to width t of the trunk of the finger portion) to the widest width T, and has a curved portion with a radius R. Moreover, the distance between the narrowest width t and the widest width T is L. Therefore, when the finger portion 13B has an angle θ between the end of the side wall and the trunk of the side wall, the widest width T of the end can be obtained by using the following equation:

$$T = t + 2*(L*\tan\theta)$$

In the finger portion 13B of the P+ doped region, the trunk portion width t (same as the narrowest width of the end, the widest end width T, the angle θ between the side walls of the end, and the distance L between the narrowest width t and widest width T, may be varied according to manufacturing processes and device characteristics for effectively improving the electric field crowding problem.

For the conventional technique, to improve the electric field crowding problem in the finger end of the LDMOS device, the end of the finger portion 13B is usually widened by widening the whole trunk portion, and the widths of the widened trunk portion and the widened end are equal. In other words, for widening the end of the finger portion 13B, the trunk portion has to be widened, entirely. However, in embodiments of the invention, only the end of the finger portion is widened, and the width of the LDMOS of the finger portion 13B is not changed. Furthermore, the end of the finger portion 13B is gradually widened, thus avoiding intense electric fields that may be caused from a sharp angle of an abruptly widening end. Therefore, the diode structure effectively improves the electric field crowding problem in the LDMOS. Moreover, layout flexibility and ability to further scale-down related devices are improved due to the smaller area of the LDMOS.

Similarly, when the diode device is formed in the region 80 in FIG. 1A, the end of the finger portion of N+ doped region 14 may have a shape symmetrically widened from the narrowest width (equal to the width of the finger trunk portion) to the widest width, and have a curved portion with a radius.

The LDMOS device shown in FIG. 2 is a reduced surface field (RESURF) transistor with lower resistance since the N type well region 11 under the isolation structure 20 can effectively reduce RESURF. Moreover, when operating the LDMOS, the diode structure in the finger end region 70 in FIG. 3 can reduce electric field generated from the interdigitated finger. In other embodiments, for example, the LDMOS device may further comprises a P type doped region (not shown) between the isolation structure 20 and N type well region 11, which also can reduce RESURF.

Referring to FIG. 3, the formation range and dopant concentration of the N type well region 11, P− body doped region 16, and P− substrate 10 may be varied properly according to the RESURF technique. Similarly, In the LDMOS structure in FIG. 2, the formation range and dopant concentration of the N type well region 11, P− body doped region 16, and P− substrate 10 may also be varied properly according to the RESURF technique. Therefore, the LDMOS of the present invention has excellent electric properties.

Figure 4:
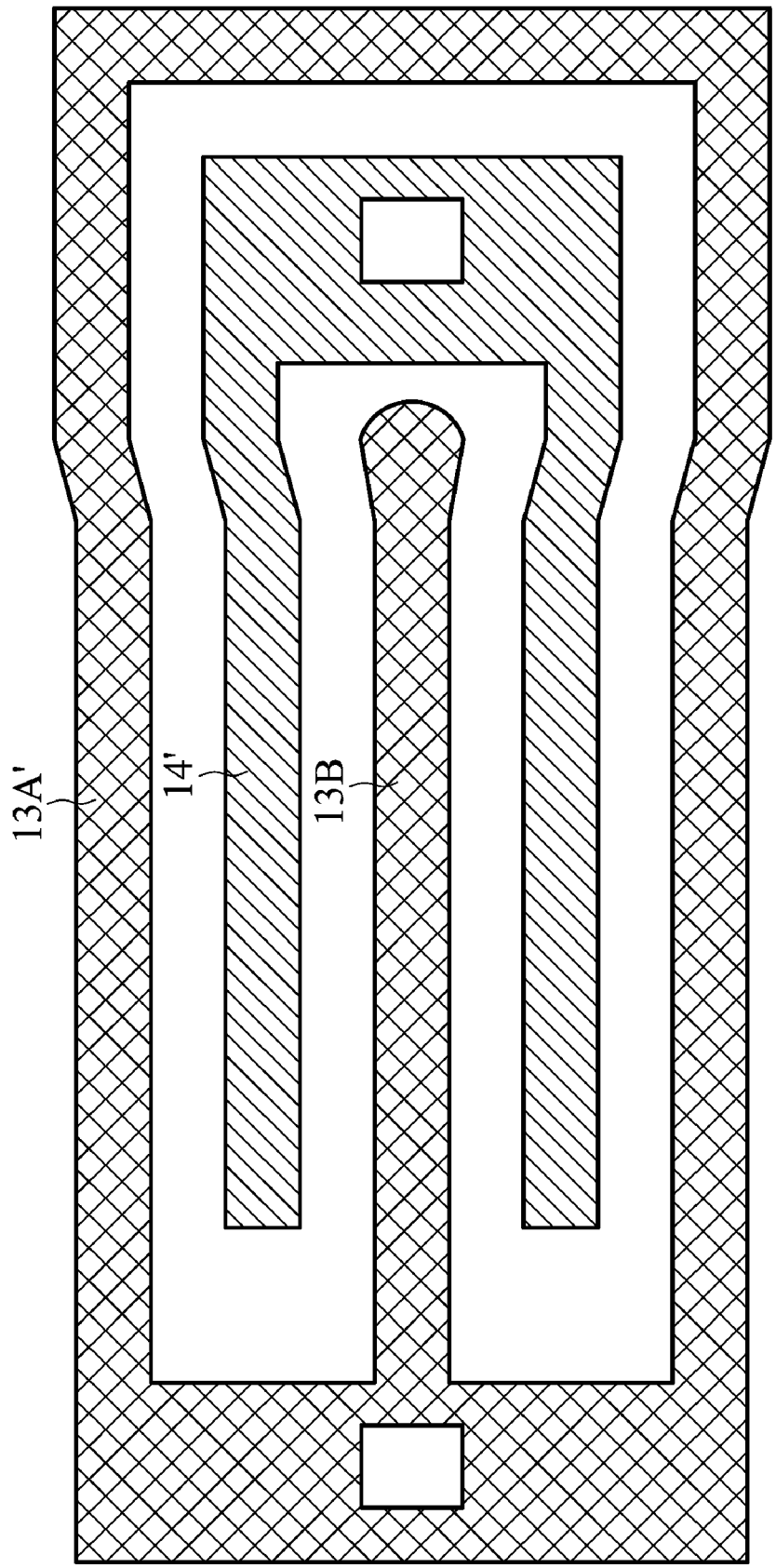
FIG. 4 is a top view of the semiconductor structure of one embodiment of the invention.

FIG. 4 is a top view of the semiconductor structure of another embodiment of the invention. Compared with FIG. 1A, in FIG. 4, the finger portions, adjacent to the end of the P+ doped finger portion 13B, of the P+ doped ring portion 13A' and N+ doped region 14' are gradually stretched out. For simplicity, the other elements in FIGS. 2 and 3 are omitted and not shown in FIG. 4.

Referring to FIG. 4, in one embodiment, the finger portions of the P+ doped ring portion 13A' and N+ doped region 14' are stretched out along a direction substantially parallel to the enlarged end of the P+ doped finger portion 13B. However, the distribution or shape of the P+ doped ring portion 13A' and N+ doped region 14' may be varied properly for improving the electric field crowding problem.

Some advantages of the semiconductor structure of the invention are described in the following. In the interdigitated P+ doped region and N+ doped region, the diode structure is formed in the region (or interdigitated region) comprising the finger end, and the LDMOS structure is formed in all the other regions. When the device operates, the diode structure in the interdigitated region can reduce electric field generated from the finger portion. Moreover, in the P+ doped region, only the finger end is widened, and the width of the finger trunk portion is not changed. Thus, the diode structure has higher field buffering effect due to the wider P+ doped finger end. In addition, since the finger end is gradually widened, intense electric fields that may be caused from a sharp angle of an abruptly widened end is avoided. Therefore, the semiconductor structure of the invention effectively improves the electric field crowding problem in the interdigitated portion of the device. Moreover, layout flexibility and ability to further scale-down related devices are improved due to the smaller area of the device.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). For example, when describing one embodiment of a P-LDMOS, another embodiment can be an N-LDMOS. Therefore, the scope of the appended claims should be accorded the broadest interpretation so as to encompass all such modifications and similar arrangements.

What is claimed is:

1. A semiconductor structure, comprising:
a first type substrate;
a first type body doped region deposited on the first type substrate;
a first type heavily-doped region deposited on the first type body doped region, wherein the first type heavily-doped region has a finger portion with an enlarged end region;
a second type well region deposited on the first type substrate;
a second type heavily-doped region deposited on the second type well region;
an isolation structure deposited between the first type heavily-doped region and the second type heavily-doped region; and
a gate structure deposited on the first type substrate between the first type heavily-doped region and the isolation structure.

2. The semiconductor structure as claimed in claim 1, wherein the finger portion of the first type heavily-doped region has a curved portion.

3. The semiconductor structure as claimed in claim 1, wherein the smallest width of the finger end of the first type heavily-doped region is equal to a width of a trunk portion of the finger portion.

4. The semiconductor structure as claimed in claim 1, wherein the first type heavily-doped region comprises a rectangular ring portion, wherein the finger portion of the first type heavily-doped region is extended from an interior sidewall of and perpendicular to the rectangular ring portion.

5. The semiconductor structure as claimed in claim 4, wherein the second type heavily-doped region is U-shaped, and deposited in a region surrounded by the rectangular ring portion of the first type heavily-doped region.

6. The semiconductor structure as claimed in claim 5, wherein the finger portion of the first type heavily-doped region and the U-shaped second type heavily-doped region are interdigitated to one another.

7. The semiconductor structure as claimed in claim 6, wherein the ring portion of the first type heavily-doped region is stretched out substantially along a direction parallel to the enlarged end of the finger portion of the first type heavily-doped region.

8. The semiconductor structure as claimed in claim 6, wherein the second type heavily-doped region is stretched out substantially along a direction parallel to the enlarged end of the finger portion of the first type heavily-doped region.

9. The semiconductor structure as claimed in claim 6, wherein the second type heavily-doped region and the ring portion of the first type heavily-doped region are stretched out substantially along directions parallel to the enlarged end of the finger portion of the first type heavily-doped region.

10. The semiconductor structure as claimed in claim 1, wherein a portion of the isolation structure and the first type body doped region is covered by the gate structure.

11. The semiconductor structure as claimed in claim 1, wherein the second type well region is deposited under the isolation structure.

12. The semiconductor structure as claimed in claim 11, wherein the second type well region is deposited under the gate structure.

13. The semiconductor structure as claimed in claim 12, wherein the second type well region is adjoined with the first type body doped region.

14. The semiconductor structure as claimed in claim 1, comprising a second type heavily-doped source region deposited on the first type body doped region between the isolation structure and the first type heavily-doped region.

15. A semiconductor structure, comprising:
a first type substrate;
a first type body doped region deposited on the first type substrate;
a first type heavily-doped region deposited on the first type body doped region, wherein the first type heavily-doped region comprises a finger portion and a rectangular ring portion, the finger portion is extended from an interior sidewall of and perpendicular to the rectangular ring portion, and an end of the finger portion has an enlarged region and a curved region;
a second type well region deposited on the first type substrate;
a second type heavily-doped region deposited on the second type well region, wherein the second type heavily-doped region is U-shaped and is deposited in a region surrounded by the rectangular ring portion of the first type heavily-doped region;
an isolation structure deposited between the first type heavily-doped region and the second type heavily-doped region; and
a gate structure deposited on the first type substrate between the first type heavily-doped region and the isolation structure.

16. The semiconductor structure as claimed in claim 15, wherein the finger portion of the first type heavily-doped region and the U-shaped second type heavily-doped region are interdigitated to one another.

17. The semiconductor structure as claimed in claim 16, wherein the ring portion of the first type heavily-doped region is stretched out substantially along a direction parallel to the enlarged end of the finger portion of the first type heavily-doped region.

18. The semiconductor structure as claimed in claim 16, wherein the second type heavily-doped region is stretched out substantially along a direction parallel to the enlarged end of the finger portion of the first type heavily-doped region.

19. The semiconductor structure as claimed in claim 16, wherein the second type heavily-doped region and the ring portion of the first type heavily-doped region are stretched out substantially along directions parallel to the enlarged end of the finger portion of the first type heavily-doped region.

* * * * *